(12) United States Patent
Park et al.

(10) Patent No.: US 6,191,467 B1
(45) Date of Patent: Feb. 20, 2001

(54) SEMICONDUCTOR DEVICE AND METHOD FOR FABRICATING THE SAME

(75) Inventors: Young June Park, Seoul; Jong Ho Lee; Hyeok Jae Lee, both of Kyungki-do, all of (KR)

(73) Assignee: Hyundai Electronics Industries Co., Ltd., Chungcheongbuk-do (KR)

( * ) Notice: Under 35 U.S.C. 154(b), the term of this patent shall be extended for 0 days.

(21) Appl. No.: 09/307,033

(22) Filed: May 7, 1999

(30) Foreign Application Priority Data

May 8, 1998 (KR) .................................................. 98-16483

(51) Int. Cl.⁷ .................................................... H01L 29/78
(52) U.S. Cl. ........................... 257/522; 257/728; 257/401
(58) Field of Search .................................... 257/522, 728, 257/618, 659, 532, 534, 535, 664, 665, 275, 401; 307/91; 438/411, 412

(56) References Cited

U.S. PATENT DOCUMENTS

| 4,106,050 | * | 8/1978 | Riseman | 357/49 |
| 4,507,845 | * | 4/1985 | McIver et al. | 29/571 |
| 5,155,061 | * | 10/1992 | O'Connor et al. | 437/86 |
| 5,209,119 | * | 5/1993 | Polla et al. | 73/723 |
| 5,227,658 | * | 7/1993 | Beyer et al. | 257/522 |
| 5,310,700 | * | 5/1994 | Lien et al. | 437/195 |
| 5,391,911 | * | 2/1995 | Beyer et al. | 257/522 |
| 5,949,144 | * | 10/1999 | Delgado et al. | 257/776 |

FOREIGN PATENT DOCUMENTS

| 62-5643 | * | 1/1987 | (JP) | 257/522 |
| 10-335449 | * | 12/1998 | (JP) | 257/522 |
| 11-97530 | * | 4/1999 | (JP) | 257/522 |

* cited by examiner

*Primary Examiner*—David Hardy
*Assistant Examiner*—Lourdes Cruz

(57) ABSTRACT

A semiconductor device and method of fabricating the same. The semiconductor device includes a first insulating film formed on a substrate and having a plurality of holes therein; a cavity formed under the first insulating film; an impurity region formed in the substrate and around the cavity; a second insulating film formed on portions of the first insulating film to fill the holes and a space between the cavity and the impurity region; a plurality of contact holes formed to expose certain portions of the impurity region; and a plurality of wiring layers formed to be in contact with the impurity region through the contact holes.

8 Claims, 8 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device and a method for fabricating the same, which can prevent a signal loss in an integrated circuit that processes radio frequency signals.

2. Discussion of the Related Art

As the silicon (Si) semiconductor fabrication technology develops, an operation frequency of integrated circuits has been gradually increasing close to the radio frequency range. If the operation frequency of a device or circuit having a silicon substrate is higher than 2 GHz, there is a signal loss along interconnections. To overcome this problem, a semiconductor material, GaAs, which exhibits a semi-insulating property, has been used instead of a Si substrate. The use of GaAs allows signal transmission up to 10 GHz in the circuit without signal loss and without having to match the impedance characteristic. However, in the case of transmitting of a signal with the operation frequency greater than 10 GHz using a GaAs substrate, a process, such as an electrolytic plating, is needed to match the impedance characteristic of a transmission line.

The above-described conventional semiconductor device has the following problems. The background technology of using a GaAs substrate for preventing the signal loss in a radio frequency processing integrated circuit is not applicable to a Si substrate.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same which can prevent a signal loss in an integrated circuit processing radio frequency signals.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the semiconductor device includes a first insulating film formed on a substrate and having a plurality of holes therein; a cavity formed under the first insulating film; an impurity region formed in the substrate and around the cavity; a second insulating film formed on portions of the first insulating film to fill the holes and a space between the cavity and the impurity region; a plurality of contact holes formed to expose certain portions of the impurity region; and a plurality of wiring layers formed to be in contact with the impurity region through the contact holes.

In another aspect of the present invention, there is provided a method for fabricating a semiconductor device including the steps of forming a first insulating film on a substrate to define a plurality of holes therein; forming a cavity under the first insulating film; forming an impurity region in the substrate and around the cavity; forming a second insulating film on portions of the first insulating film to fill the holes and a space between the cavity and the impurity region; forming a plurality of contact holes to expose certain portions of the impurity region; and forming a plurality of wiring layers in contact with the impurity region through the contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention, wherein.

DETAILED DESCRIPTION OF THE PREFERRED EMBODIMENTS

Reference will now be made in detail to the preferred embodiments of the present invention, examples of which are illustrated in the accompanying drawings. FIGS. 1A–2C will be referred to for explaining a semiconductor device and a method of forming the same according to the general embodiment of the present invention.

Figure 1A:
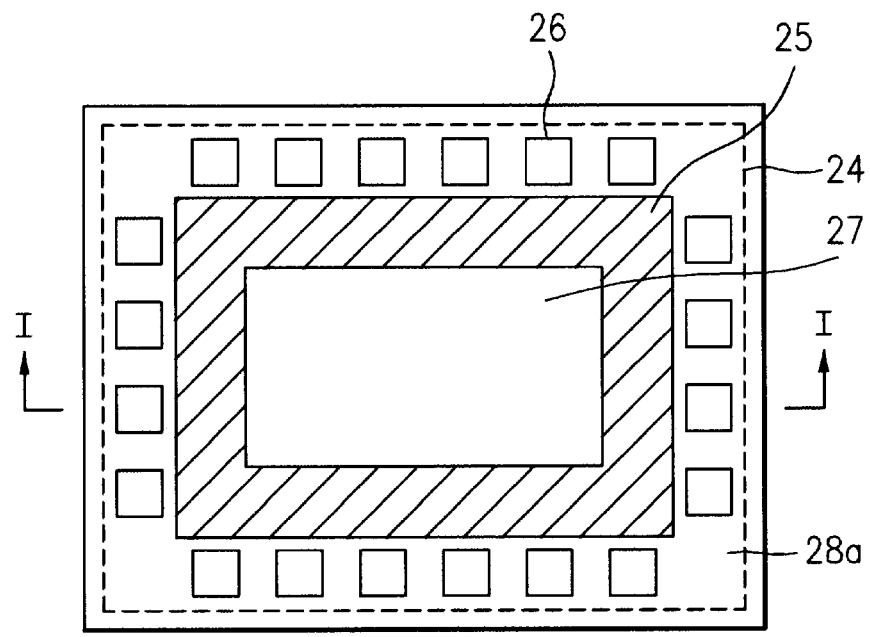
FIG. 1A illustrates a plan view of a semiconductor device in accordance with a general embodiment of the present invention.
Figure 1B:
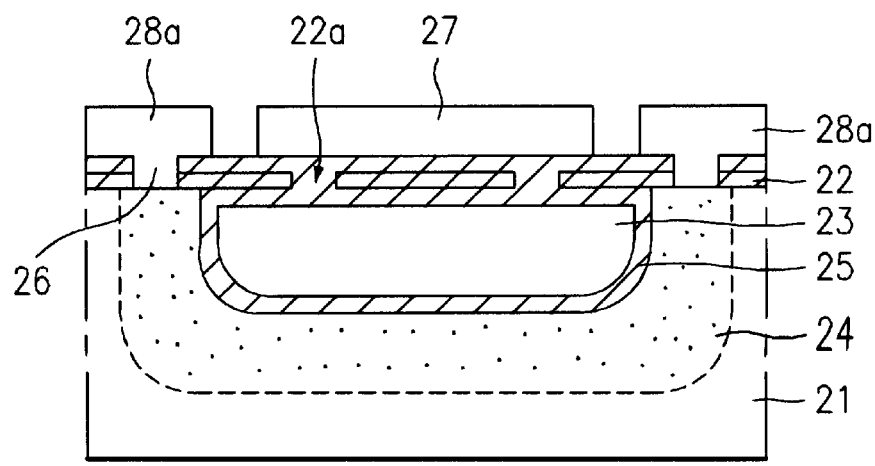
FIG. 1B illustrates a sectional view across line I—I in FIG. 1A.

Referring to FIGS. 1A and 1B, the semiconductor device without an operation frequency loss according to the general embodiment of the present invention includes a first oxide film 22 having a plurality of holes 22a initially exposing certain regions of a silicon substrate 21, a cavity 23 etched to a certain depth in the silicon substrate 21, and an N-type heavily doped impurity region 24 (dotted region in FIG. 1A) formed within the silicon substrate 21.

The semiconductor device further includes a second oxide film 25 filling a space between the N-type impurity region 24 and the cavity 23, a device formation region 27 formed in one region of the second oxide film 25 above the cavity 23 for forming active or passive devices, contact holes 26 formed through portions of the first and second oxide films 22 and 25 to expose portions of the N-type impurity region 24, and a ground line 28a formed around the device formation region 27 such that the ground line 28a makes contact with the N-type impurity region 24 through the contact holes 26.

Figure 2A:
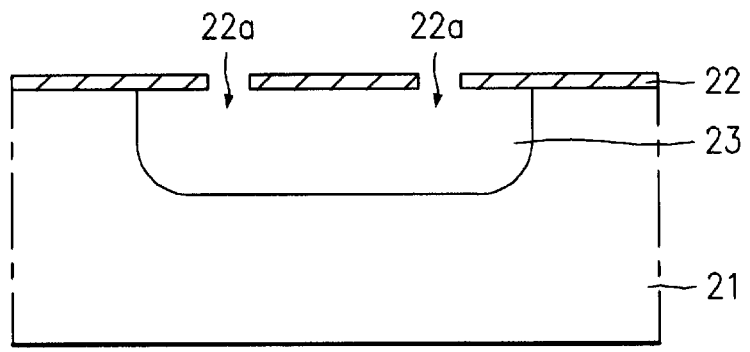
FIGS. 2A~2C illustrate sectional views for explaining a method of fabricating a semiconductor device in accordance with the general embodiment of the present

Referring to FIG. 2A, a method for fabricating the semiconductor device of FIGS. 1A and 1B in accordance with the general embodiment of the present invention includes forming the first oxide film 22 on the silicon substrate 21 by a thermal oxidation, a chemical vapor deposition, etc., and etching certain portions of the first oxide film 22 to form the plurality of holes 22a therein. Then the silicon substrate 21 is subjected to isotropic etching through the plurality of holes 22a to etch an appropriate thickness of the silicon substrate 21 underneath the first oxide film 22, thereby forming the cavity 23 in the silicon substrate 21.

Figure 2B:
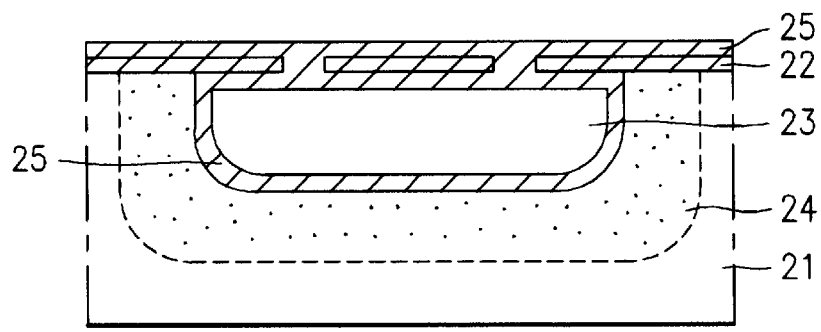

Then, as shown in FIG. 2B, the N-type impurity region 24 is formed using $PoCl_3$ at a surface region of the cavity 23. Then, the second oxide film 25 is deposited, e.g., by using a low pressure chemical vapor deposition, on top and bottom surfaces of the first oxide film 22 to fill the holes 22a and the space between the cavity 23 and the N-type impurity region 24.

Figure 2C:
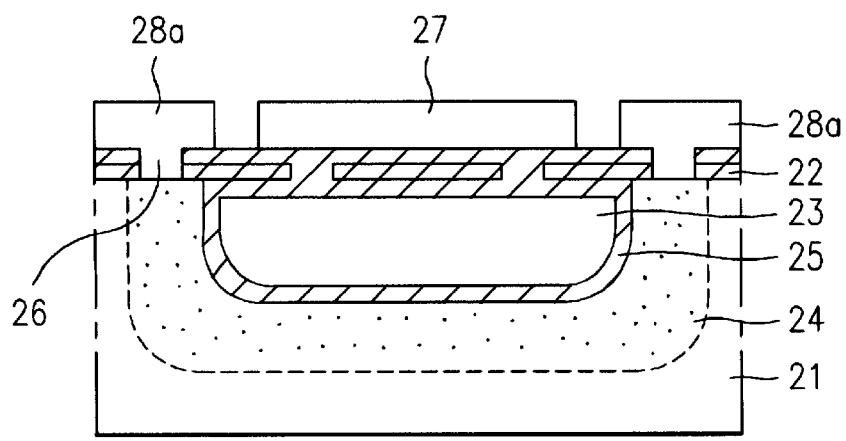

Next, as shown in FIG. 2C, a semiconductor layer is deposited on the entire surface of the second oxide film 25 and subjected to anisotropic etching to form the device formation region 27 on a middle portion of the second oxide film 25 over the cavity 23. The contact holes 26 are formed to expose certain portions of the N-type impurity region 24 around the device formation region 27. Then a metal layer is deposited on the entire surface and is subjected to anisotropic etching to form the ground line 28a in contact with the N-type impurity region 24 through the contact holes 26. The ground line 28a is spaced a certain distance from the device formation region 27. The contact holes 26 are formed to expose a portion of the cavity 23 to allow the ground line 28a to contact with the cavity 23 and the N-type impurity region 24.

A semiconductor device and a method of forming a signal transmission line of the semiconductor device will be explained in accordance with the first embodiment of the present invention referring to FIGS. 3A–4E.

Figure 3A:
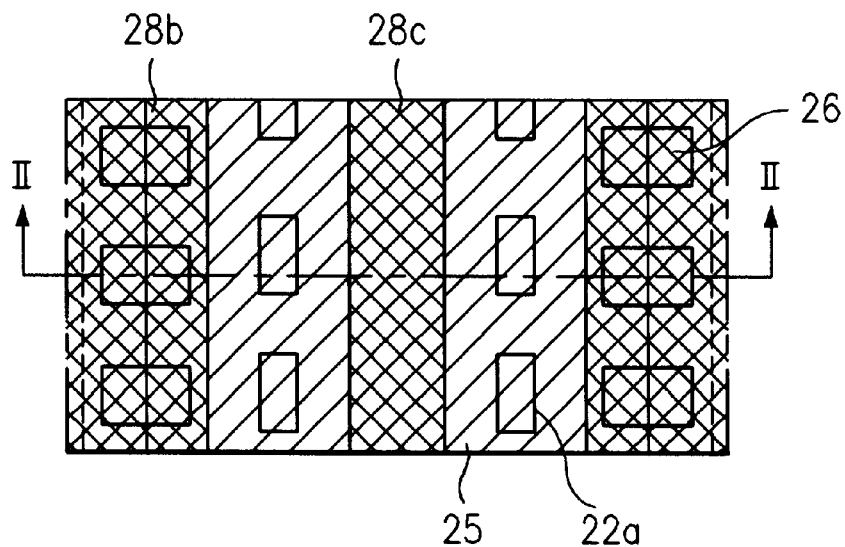
FIG. 3A illustrates a plan view of a semiconductor device in accordance with a first embodiment of the present invention.
Figure 3B:
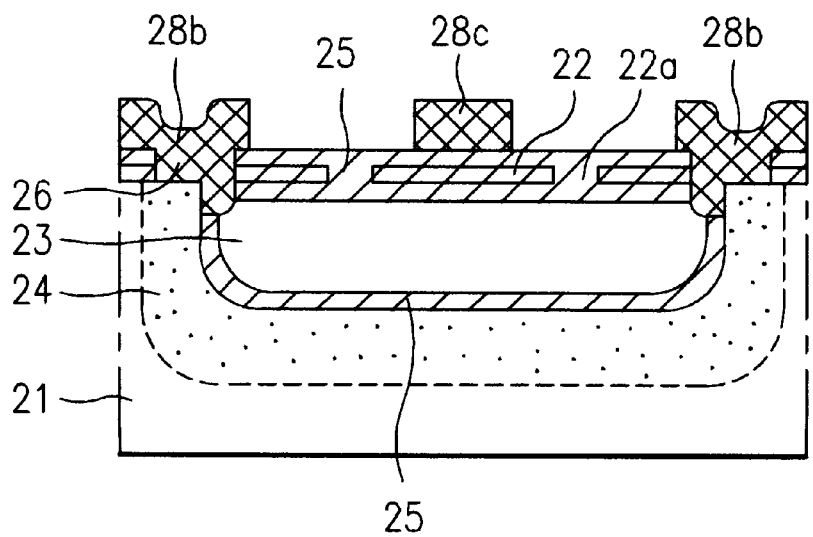
FIG. 3B illustrates a sectional view across line II—II in FIG. 3A.

As shown in FIGS. 3A and 3B, the semiconductor device includes a first oxide film 22 formed on a surface of a silicon substrate 21 having holes 22a therein at fixed intervals, a heavily doped N-type impurity region 24, a cavity 23 etched to a particular depth in the silicon substrate 21, a second oxide film 25 covering the surface of the silicon substrate 21 doped with the N-type impurity region 24 and filling the holes 22a, a plurality of contact holes 26 formed through the second oxide film 25 to expose portions of the N-type region 24 on both sides of the cavity 23, a signal transmission line 28c arranged in one direction on a particular portion of the second oxide film 25 over the cavity 23, and a plurality of ground lines 28b formed in contact with the N-type impurity region 24 through the contact holes 26. The contact holes 26 may be formed to expose certain portions of the cavity 23 for allowing the ground lines 28b to contact the cavity 23 and the N-type impurity region 24.

Figure 4A:
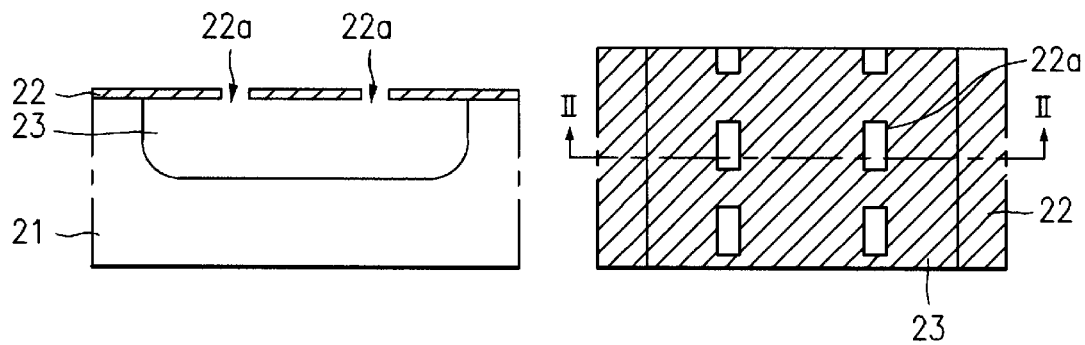
FIGS. 4A~4E illustrate sectional views for explaining a method of fabricating the semiconductor device in accordance with the first embodiment of the present invention.

Referring to FIG. 4A, the method for fabricating the aforementioned semiconductor device of FIGS. 3A and 3B in accordance with the first embodiment of the present invention, includes forming the first oxide film 22 on the silicon substrate 21 by a thermal oxidation, a chemical vapour deposition, or the like, and etching the first oxide film 22 to form the holes 22a in particular regions of the silicon substrate 21. Then the silicon substrate 21 is subjected to isotropic etching through the holes 22a to etch a portion of the silicon substrate 21 beneath the first oxide film 22 to an appropriate thickness, thereby forming the cavity 23 in the silicon substrate 21.

Figure 4B:
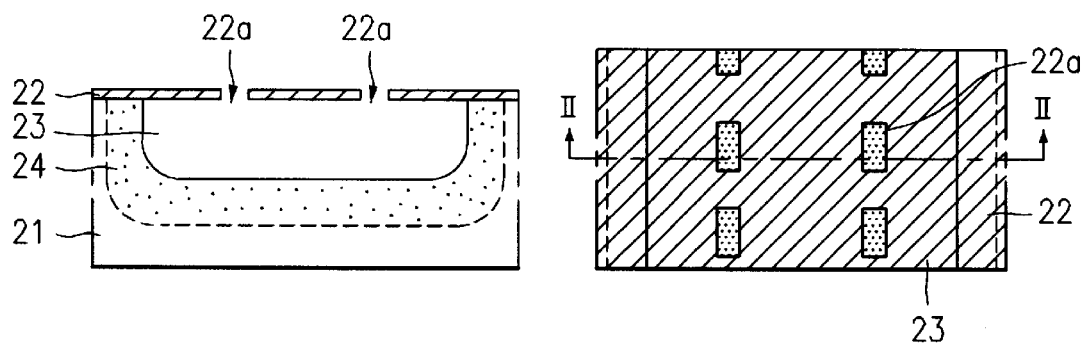

As shown in FIG. 4B, the heavily doped N-type impurity region 24 is formed using $PoCl_3$ at a surface of the silicon substrate 21 having the cavity 23.

Figure 4C:
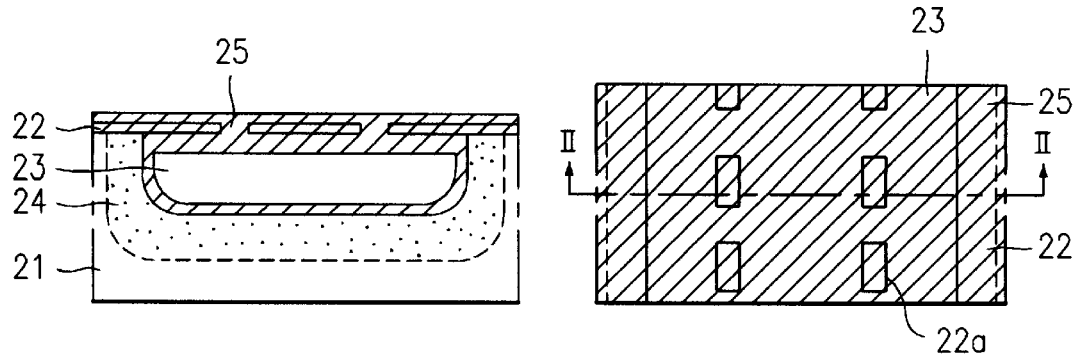

As shown in FIG. 4C, the second oxide film 25 is deposited by using a low pressure vapor deposition on top and bottom surfaces of the first oxide film 22 to fill the holes 22a and to cover a surface of the silicon substrate 21 having the cavity 23 formed therein.

Figure 4D:
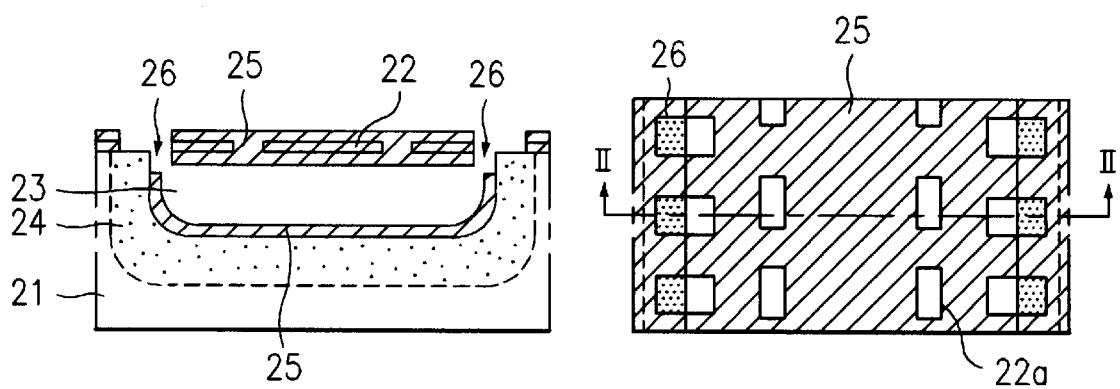

As shown in FIG. 4D, the first, and second oxide films 22 and 25 are subjected to anisotropic etching to expose the N-type impurity region 24 at fixed intervals along both sides of the cavity 23 to form the contact holes 26. In the alternative, the plurality of contact holes 26 may be formed by anisotropically etching the first and second oxide films 22 and 25 to expose the N-type impurity region 24 on both sides of the cavity 23 at fixed intervals after etching the second oxide film 25 to a deposited thickness. The latter method may be suitable for application in a case when the ground lines 28b and signal transmission line 28c to be formed later are integrated with chips of other functions. The contact holes 26 may also be formed to expose certain portions of the cavity 23 and the N-type impurity region 24.

Figure 4E:
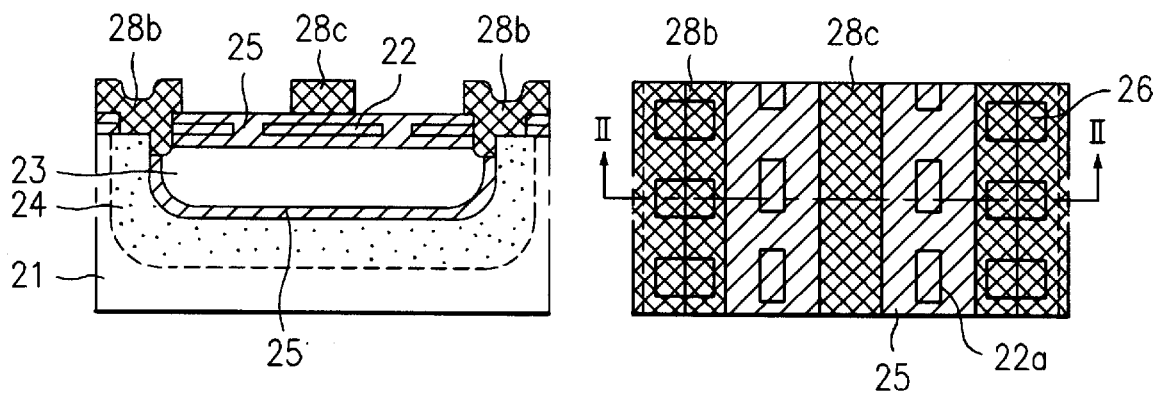

Then, as shown in FIG. 4E, a metal layer is deposited on the entire surface thereof and is subjected to anisotropic etching to form the ground lines 28b in contact with the N-type impurity region 24 through the contact holes 26 and to form the signal transmission line 28c on the second oxide film 25 in one direction between the ground lines 28b.

A semiconductor device and a method for fabricating the same in accordance with the second embodiment of the present invention will be explained referring to FIGS. 5A–6E, which is designed for preventing signal loss by isolating a device formed on an SOI substrate from noise sources. In this example, an active device is formed applying the SOI substrate to the device formation region 27.

Figure 5A:
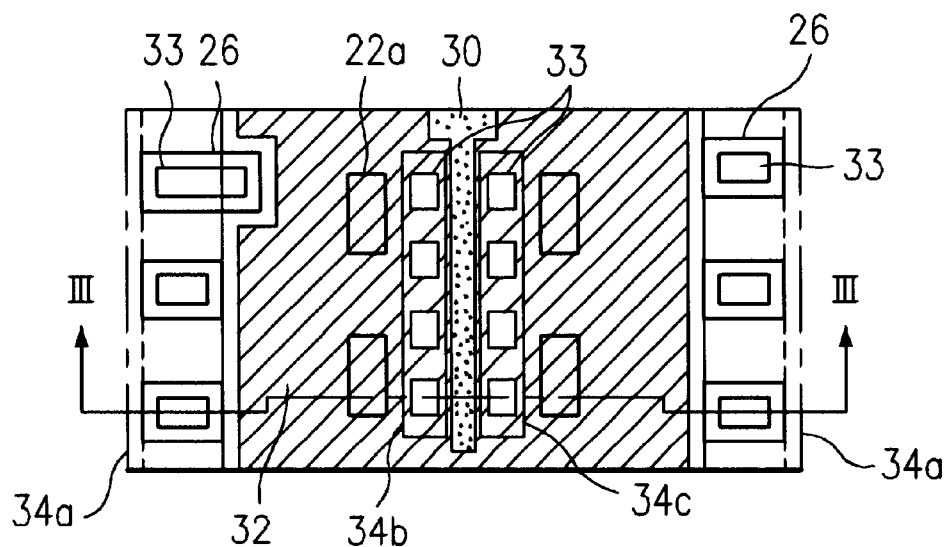
FIG. 5A illustrates a plan view of a semiconductor device in accordance with a second embodiment of the present invention.
Figure 5B:
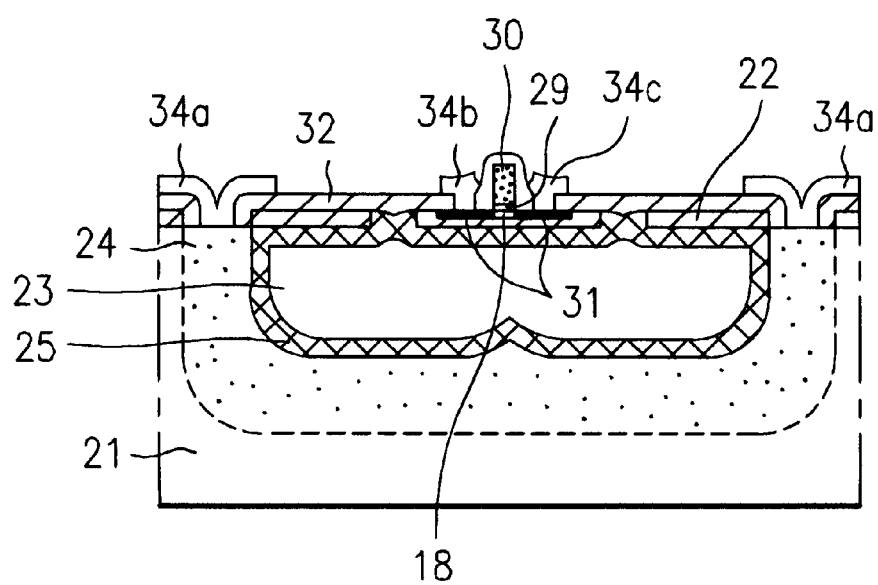
FIG. 5B illustrates a sectional view across line III—III in FIG. 5A.

Referring to FIGS. 5A and 5B, the semiconductor device in accordance with the second embodiment of the present invention includes a first oxide film 22 having holes 22a in particular regions on a silicon substrate 21, and a cavity 23 etched to a particular depth in the silicon substrate 21 under a particular part of the first oxide film 22.

The semiconductor device further includes a heavily doped N-type impurity region 24 formed at a surface of the silicon substrate 21 having the cavity 23 formed therein, a second oxide film 25 formed along a surface of the cavity 23 in the silicon substrate 21 and along a bottom surface of the first oxide film 22 to fill the holes 22a, contact holes 26 formed to expose particular parts of top portions of the N-type impurity region 24 on both sides of the cavity 23, a semiconductor layer 18 formed in a particular region of the first oxide film 22 over the cavity 23, and a gate oxide film 29 and a gate electrode 30 formed on a top portion of the semiconductor layer 18 in one direction.

The semiconductor device further includes source/drain regions 31 provided in the semiconductor layer 18 on both sides of the gate electrode 30, where the source/drain regions 31 may be lightly doped, a fourth oxide film 32 formed on the first oxide film 22, a plurality of contact holes 33 formed to expose the source/drain regions 31 and the N-type impurity region 24, metal wiring lines 34b and 34c formed in contact with the source/drain regions 31 through the contact holes 33, and ground lines 34a formed in contact with the N-type impurity region 24 through the contact holes 33.

Figure 6A:
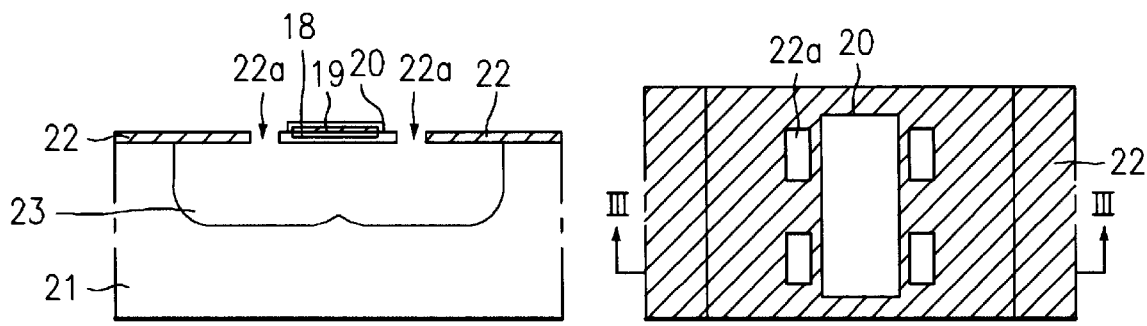
FIGS. 6A~6E illustrate sectional views for explaining a method of fabricating the semiconductor device in accordance with the second embodiment of the present invention.

Referring to FIG. 6A, a method for fabricating the semiconductor device of FIGS. 5A and 5B in accordance with the second embodiment of the present invention, includes the steps of forming the single crystal semiconductor layer 18 on the silicon substrate 21, depositing a third oxide film 19 on the silicon substrate 21 inclusive of the semiconductor layer 18, etching the third oxide film 19 to form the third oxide film 19 only on the semiconductor layer 18, depositing a nitride film 20 on the entire surface of the formed structure, and subjecting the nitride film 20 to anisotropic etching to cover only the third oxide film 19 and the semiconductor layer 18. Then a thermal oxidation is performed to form the first oxide film 22 beneath the semiconductor layer 18 and on a surface of the silicon substrate 21. Then the first oxide film 22 on both sides of the semiconductor layer 18 is subjected to anisotropic etching to form the holes 22a, where the holes 22a are spaced a certain distance from the semiconductor layer 18. The silicon substrate 21 is subjected to isotropic etching through the holes 22a to form the cavity 23.

Figure 6B:
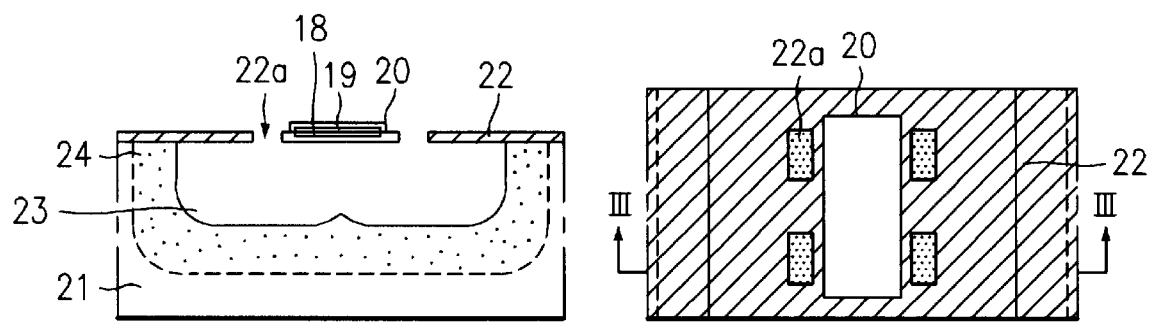

As shown in FIG. 6B, a surface of the silicon substrate 21 having the cavity 23 formed therein is doped with $PoCl_3$ and diffused to form the heavily doped N-type impurity region 24.

Figure 6C:
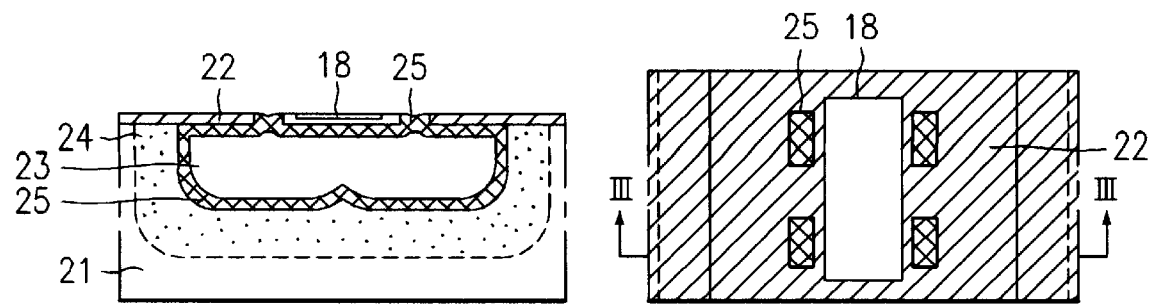

As shown in FIG. 6C, the second oxide film 25 is formed on a surface of the silicon substrate 21 having the N-type impurity region 24 and on top and bottom surfaces of the first oxide film 22 to fill the holes 22a. Then the silicon substrate 21 is anisotropically etched as much as the deposited thickness to expose the first oxide film 22. The nitride film 20 and the third oxide film 19 are then removed.

Figure 6D:
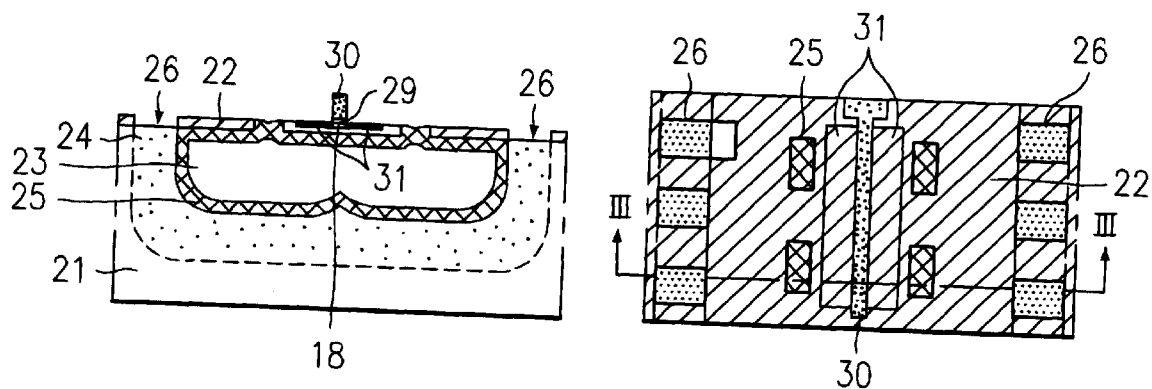

As shown in FIG. 6D, an oxide film and a silicon layer are deposited on the semiconductor layer 18 and subjected to anisotropic etching, using a mask for gate formation, to form the gate oxide film 29 and the gate electrode 30. Then the first oxide film 22 on both sides of the cavity 23 is etched to expose the N-type impurity region 24 to form the contact holes 26. The contact holes 26 may be formed to expose certain portions of the cavity 23. The semiconductor layer 18 on both sides of the gate electrode 30 is heavily doped with N-type ions to form the source/drain regions 31 therein. In this instance, the exposed impurity region 24 is also doped with N-type ions. In the alternative, the source/drain regions 31 may be lightly doped.

Figure 6E:
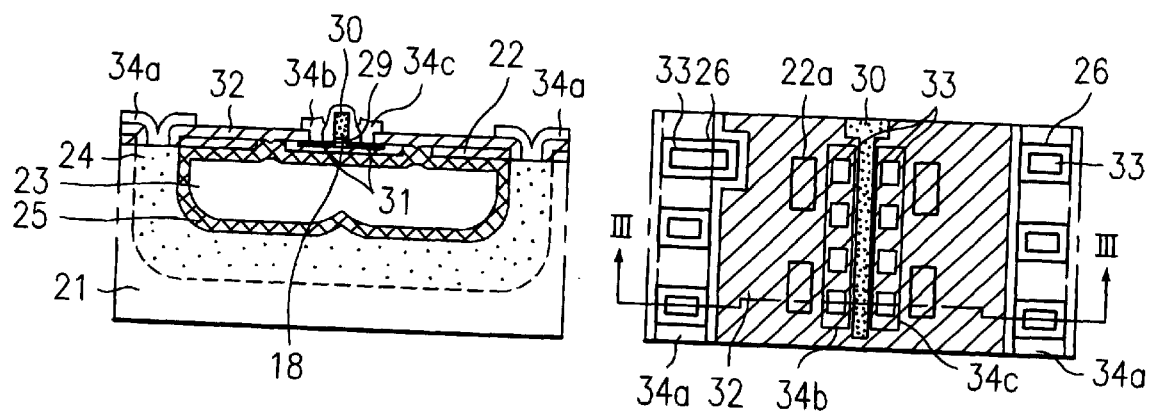

Then, as shown in FIG. 6E, the fourth oxide film 32 is deposited by a chemical vapor deposition, etc., and the contact holes 33 are formed such that the contact holes 33 expose certain portions of the source/drain regions 31 and the N-type impurity region 24. Then the entire surface of the semiconductor device is covered with a metal layer. By patterning the metal layer, metal wiring layers 34b and 34c being in contact with the source/drain regions 31 through the contact holes 33 and the ground lines 34a being in contact with the N-type impurity region 24 through the contact holes 38 are formed. In the alternative, in case that the contact holes 26 are formed to expose a portion of the cavity 23, the ground lines 34a may be formed to contact the cavity 23 and the N-type impurity region 24.

The semiconductor device and the method for fabricating the same according to the general, first and second embodiments of the present invention have the following advantages.

First, the formation of two ground lines in contact with an impurity region in a silicon substrate for one signal transmission line minimizes a signal loss in the signal transmission line.

Second, a signal loss can be prevented by perfectly and completely blocking the transmission of noise to semiconductor devices by forming a cavity in a silicon substrate and by forming a heavily doped impurity region in a surface of the silicon substrate.

It will be apparent to those skilled in the art that various modifications and variations can be made in the semiconductor device and the method for fabricating the same according to the embodiments of the present invention without departing from the spirit or scope of the invention. Thus, it is intended that the present invention cover the modifications and variations of this invention provided they come within the scope of the appended claims and their equivalents.

What is claimed is:

1. A semiconductor device comprising:

a first insulating film formed on a substrate and having a plurality of holes therein;

a cavity formed under the first insulating film;

an impurity region formed in the substrate and around the cavity;

a second insulating film formed on portions of the first insulating film to fill the holes and a space between the cavity and the impurity region;

a plurality of contact holes formed to expose certain portions of the impurity region; and a plurality of wiring layers formed to be in contact with the impurity region through the contact holes.

2. A semiconductor device as claimed in claim 1, further comprising:

at least one of a signal line and an active device formed on the second insulating film between the wiring layers.

3. A semiconductor device as claimed in claim 1, wherein the plurality of contact holes further expose certain portions of the cavity.

4. A semiconductor device as claimed in claim 3, wherein the plurality of wiring layers further contact the exposed portions of the cavity.

5. A semiconductor device as claimed in claim 1, wherein the wiring layers are ground lines.

6. A semiconductor device as claimed in claim 1, further comprising:

a semiconductor layer formed on the impurity region of the substrate;

a gate electrode formed on the semiconductor layer; and a third insulating film formed on the second insulating film to define second contact holes therethrough.

7. A semiconductor device as claimed in claim 6, wherein the semiconductor layer includes source and drain regions formed on sides of the gate electrode.

8. A semiconductor device as claimed in claim 6, further comprising:

second metal wiring layers contacting the semiconductor layer through the second contact holes.

* * * * *